(12) United States Patent
Lin

(10) Patent No.: US 9,538,679 B1
(45) Date of Patent: Jan. 3, 2017

(54) POWER TRANSMISSION STRUCTURE OF POWER SUPPLY UNIT

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 14/857,030

(22) Filed: Sep. 17, 2015

(51) Int. Cl.
*H05K 7/00* (2006.01)
*H05K 7/02* (2006.01)

(52) U.S. Cl.
CPC ...................................... *H05K 7/02* (2013.01)

(58) Field of Classification Search
None
See application file for complete search history.

(56) References Cited

U.S. PATENT DOCUMENTS

| | | | | |
|---|---|---|---|---|
| 6,176,710 B1* | 1/2001 | Ewing | .................. | H01R 11/283 439/564 |
| 6,442,017 B1* | 8/2002 | Ewing | .................... | G06F 1/189 174/38 |
| 6,739,682 B2* | 5/2004 | Shih | ..................... | A47B 88/044 312/223.1 |
| 7,158,370 B2* | 1/2007 | Kaszeta | .............. | H01M 2/1077 361/626 |
| 8,033,621 B2* | 10/2011 | Liang | ................... | H05K 7/1489 312/334.4 |
| 9,048,721 B2* | 6/2015 | Abe | ....................... | H02M 7/003 |
| 9,155,220 B2* | 10/2015 | Yokosawa | ............ | H05K 7/1489 |
| 9,363,921 B1* | 6/2016 | Chen | ..................... | H05K 7/1489 |
| 2002/0084734 A1* | 7/2002 | Shih | ...................... | A47B 88/044 312/334.4 |
| 2007/0252169 A1* | 11/2007 | Tokuyama | ............ | H02M 7/003 257/162 |
| 2008/0164789 A1* | 7/2008 | Williams | ............... | A47B 88/00 312/223.1 |
| 2010/0025126 A1* | 2/2010 | Nakatsu | .................. | B60L 11/00 180/65.1 |
| 2013/0087518 A1* | 4/2013 | He | ........................ | H05K 7/1489 211/26 |
| 2014/0363109 A1* | 12/2014 | Chen | .................... | A47B 88/044 384/22 |
| 2015/0048041 A1* | 2/2015 | Chuang | ................ | H05K 7/1489 211/175 |
| 2015/0128409 A1* | 5/2015 | Chen | ...................... | F21V 31/04 29/829 |

(Continued)

*Primary Examiner* — Xanthia C Cunningham
(74) *Attorney, Agent, or Firm* — Ming Chow; Sinorica, LLC

(57) ABSTRACT

A power transmission structure of a power supply unit includes a base plate. The base plate is provided with a plurality of spaced metallic plates. One end of each metallic plate is provided with a first connecting portion and the other end is provided with a second connecting portion to connect the components of the power supply unit respectively for power transmission. Thus, the present invention can take the place of conventional power cords, and the power transmission structure can be flattened to decrease the space occupied by the power transmission device, such that the required interior accommodation space of the power supply unit can be decreased effectively and the volume of the power supply unit can be reduced.

10 Claims, 5 Drawing Sheets

(56) References Cited

U.S. PATENT DOCUMENTS

| | | | |
|---|---|---|---|
| 2015/0201754 A1* | 7/2015 | Chen .................... | A47B 96/025 248/219.3 |
| 2015/0380908 A1* | 12/2015 | Hwang ................... | H01G 4/33 361/306.1 |
| 2016/0102814 A1* | 4/2016 | Green .................... | F21K 9/175 362/221 |
| 2016/0172807 A1* | 6/2016 | Clark-Ward .......... | F21V 21/096 439/39 |
| 2016/0245457 A1* | 8/2016 | Skull ....................... | G06F 1/16 |

* cited by examiner

POWER TRANSMISSION STRUCTURE OF POWER SUPPLY UNIT

BACKGROUND OF THE INVENTION

1. Field of the Invention

The present invention relates to a power transmission device, and more particularly to a power transmission structure of a power supply unit.

2. Description of the Prior Art

The interior of a conventional power supply unit is provided with a plurality of power cords to connect components and to connect a power input end with a power converting device and to connect the power converting device with a power output end for power transmission. In general, the radial cross-section of a conventional power cord has a circular shape. A conventional power supply unit is provided with power cords having a diameter of at least 8 mm as power transmission. With the power cords to connect the components of the power supply unit, the power cords occupy too much space, so the power supply unit must have a certain volume and interior space. Accordingly, the inventor of the present invention has devoted himself based on his many years of practical experiences to solve these problems.

SUMMARY OF THE INVENTION

The primary object of the present invention is to provide a power transmission structure of a power supply unit, which is able to decrease the space occupied by the power transmission device, such that the required interior accommodation space of the power supply unit can be decreased effectively and the volume of the power supply unit can be reduced.

In order to achieve the object, the power transmission structure of a power supply unit of the present invention comprises a base plate, a positioning plate, a plurality of metallic plates, a press plate, and a fixing plate. The base plate is made of an insulation material and disposed at an inner wall of the power supply unit. The positioning plate is made of an insulation material. The positioning plate is parallel to the base plate and disposed on the base plate. The positioning plate is formed with a plurality of through troughs. The through troughs are spaced and parallel to each other. The metallic plates are located in the through troughs of the positioning plate. One end of each metallic plate is provided with a first connecting portion. The first connecting portion perpendicularly extends out of the positioning plate. Another end of each metallic plate is provided with a second connecting portion. The second connecting portion perpendicularly extends out of the positioning plate. The press plate is made of an insulation material. The press plate is parallel to the metallic plates and disposed on the metallic plates. Both the first connecting portions and the second connecting portions of the metallic plates extend out of the press plate. The fixing plate is disposed on the press plate. The fixing plate has a width greater than that of the press plate. Two sides of the fixing plate are provided with lip portions. The fixing plate is formed with an accommodation space between the lip portions for accommodating the press plate, the positioning plate and the base plate. The lip portions are formed with a plurality of spaced locking holes. The fixing board is locked to the inner wall of the power supply unit via a plurality of locking members.

The power transmission structure of the power supply unit of the present invention uses the first connecting portions and the second connecting portions of the metallic plates to connect the components of the power supply unit respectively for power transmission via the metallic plates. Thus, the power transmission structure can be flattened to decrease the space occupied by the power transmission device, such that the required interior accommodation space of the power supply unit can be decreased effectively and the volume of the power supply unit can be reduced.

DETAILED DESCRIPTION OF THE PREFERRED EMBODIMENTS

Embodiments of the present invention will now be described, by way of example only, with reference to the accompanying drawings.

Figure 1:
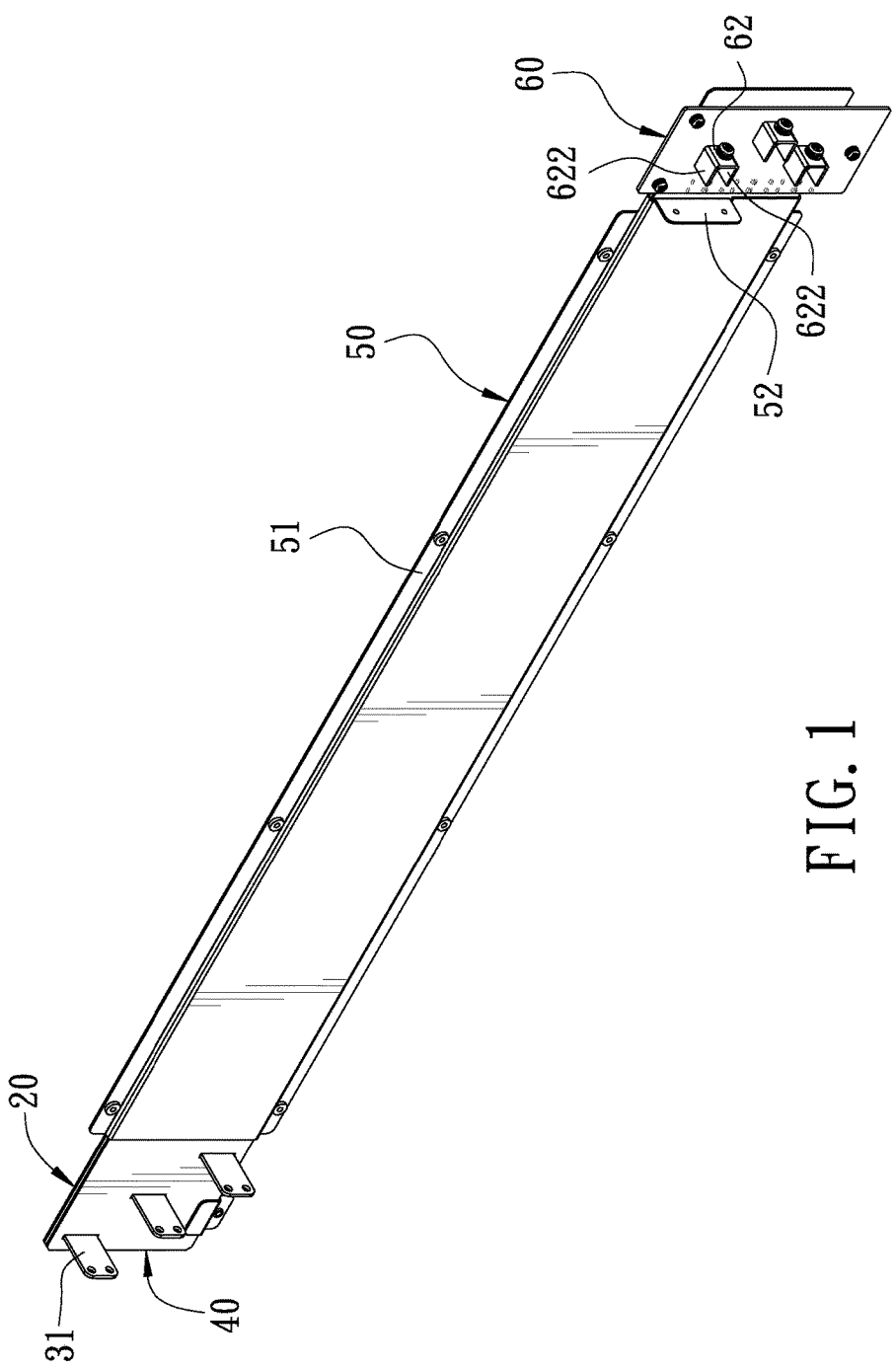
FIG. 1 is a perspective view of the present invention.
Figure 2:
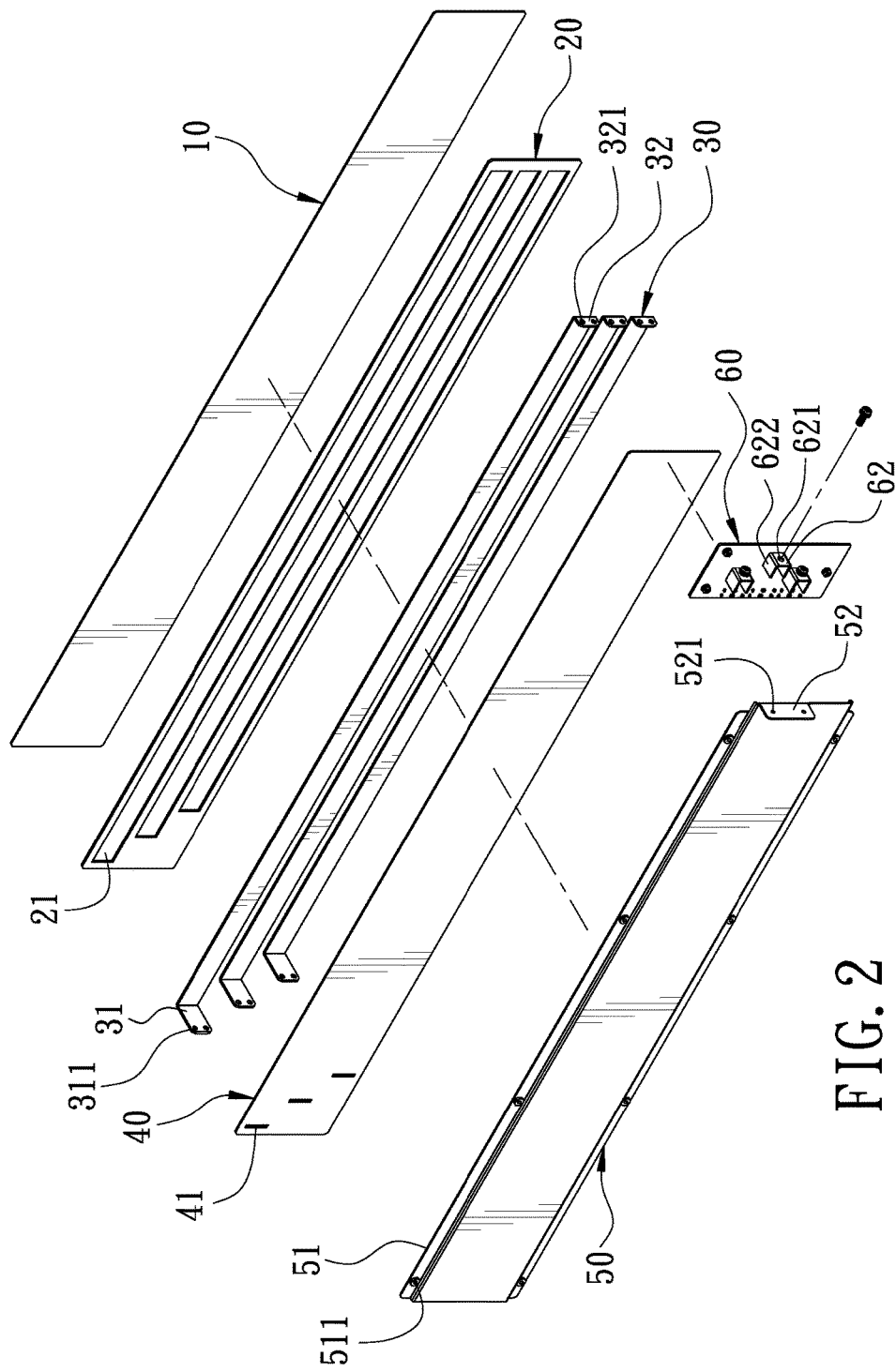
FIG. 2 is an exploded view of the present invention.
Figure 3:
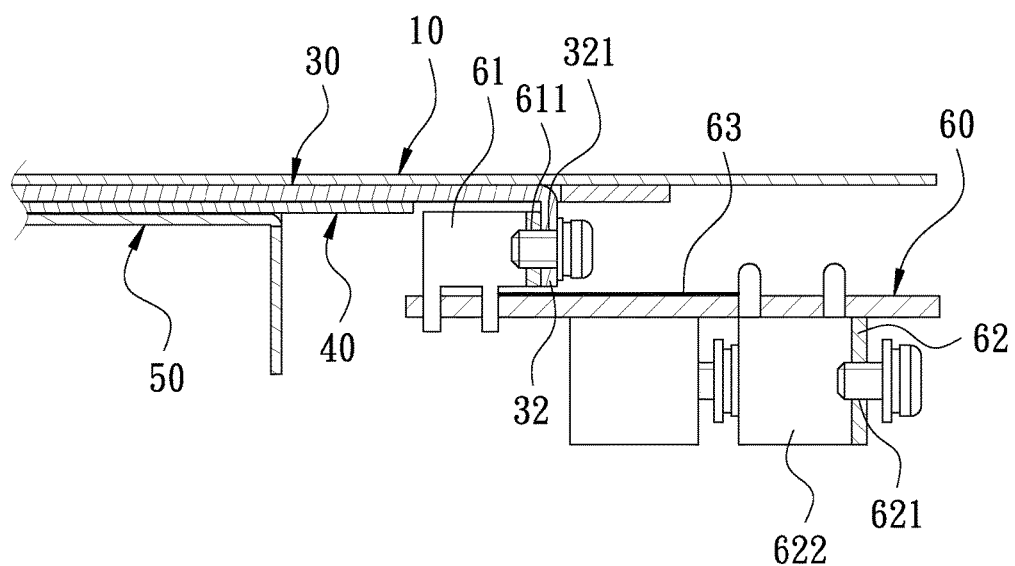
FIG. 3 is a sectional view of the present invention.
Figure 4:
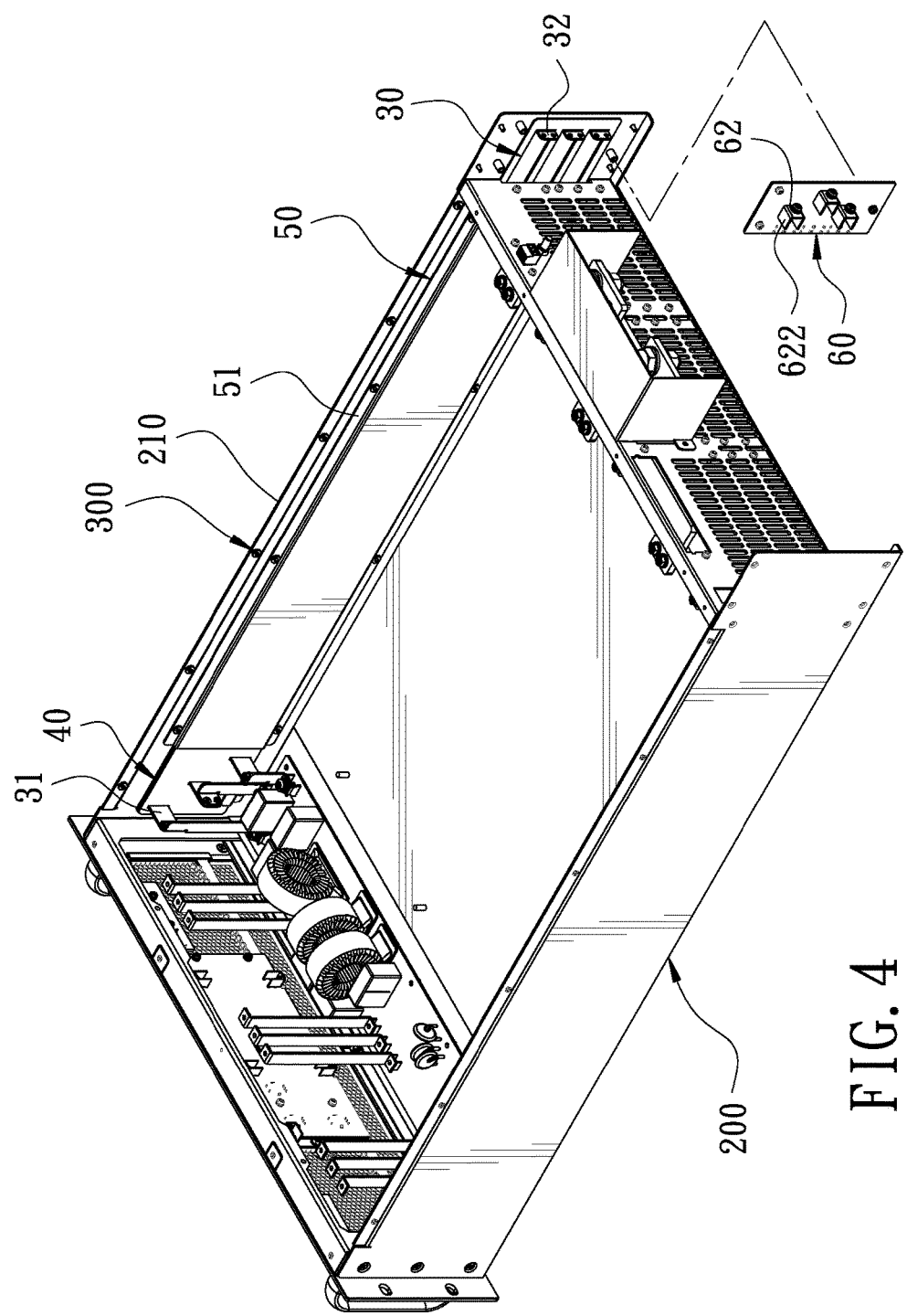
FIG. 4 is a schematic view showing the assembly of the present invention.

FIG. 1 is a perspective view of the present invention. FIG. 2 is an exploded view of the present invention. FIG. 3 is a sectional view of the present invention. The present invention discloses a power transmission structure of a power supply unit. FIG. 4 is a schematic view showing the assembly of the present invention. The power supply unit 200 has a case 210. The power transmission structure comprises a base plate 10, a positioning plate 20, a plurality of metallic plates 30, a press plate 40, a fixing plate 50, and a cover plate 60.

The base plate 10 is an elongate plate. The base plate 10 is made of an insulation material to provide an insulation effect. The base plate 10 is disposed on the inner wall of the case 210.

The positioning plate 20 is parallel to the base plate 10 and disposed on the base plate 10. The positioning plate 20 is also made of an insulation material to provide an insulation effect. The positioning plate 20 is an elongate plate corresponding to the base plate 10. The positioning plate 20 has a width equal to that of the base plate 10. The positioning plate 20 has a length slightly less than that of the base plate 10. The positioning plate 20 is formed with a plurality of through troughs 21. The through troughs 21 are elongate through troughs which are disposed in a longitudinal direction of the positioning plate 20 and spaced and parallel to each other. First ends of the through troughs 21 are disposed at different positions of the positioning plate 20, and opposing second ends of the through troughs 21 are flush with each other.

The metallic plates 30 are located in the through troughs 21 of the positioning plate 20. The metallic plates 30 are elongate plates corresponding to the through troughs 21 respectively so as to be engaged and positioned in the through troughs 21. One end of each metallic plate 30 is bent to form a first connecting portion 31. The first connecting portion 31 perpendicularly extends out of the positioning plate 20. The first connecting portion 31 is formed with a plurality of locking holes 311. Another end of each metallic plate 30 is bent to form a second connecting portion 32. The second connecting portion 32 perpendicularly extends out of the positioning plate 20. The second connecting portion 32 is formed with a plurality of locking holes 321. The first connecting portions 31 of the metallic plates 30 correspond to the first ends of the through troughs 21, and the second connecting portions 32 of the metallic plates 30 correspond to the second ends of the through troughs 21. The lengths of the first connecting portions 31 and the second connecting portions 32 can be different according to the demand of use. In the present invention, the length of the first connecting portion 31 is greater than that of the second connecting portion 32.

The press plate 40 is parallel to the positioning plate 20 and the metallic plates 30 and disposed on the metallic plates 30. The press plate 40 is also made of an insulation material to provide an insulation effect. The press plate 40 is an elongate plate corresponding to the positioning plate 20. The press plate 40 has a width equal to that of the positioning plate 20. The press plate 40 has a length slightly less than that of the positioning plate 20. The press plate 40 has a first end corresponding to the first end of the positioning plate 20 and a second end corresponding to the other ends of the through troughs 21. The press plate 40 is formed with a plurality of slots 41 corresponding to the first connecting portions 31 of the metallic plates 30 for the first connecting portions 31 to extend out of the slots 41. The second end of the press plate 40 leans against the second connecting portions 32 of the metallic plates 30, and the second connecting portions 32 protrude out of the press plate 40.

The fixing plate 50 is parallel to the press plate 40 and disposed on the press plate 40. The fixing plate 50 is an elongate plate. The fixing plate 50 has a width greater than that of the press plate 40. The fixing plate 50 has a length less than that of the press plate 40. The slots 41 of the press plate 40 are exposed out of the fixing plate 50. Two longitudinal sides of the fixing plate 50 are provided with lip portions 51. The lip portions 51 slightly protrude toward the press plate 40, such that the fixing plate 50 is formed with a concave accommodation space between the lip portions 51 to accommodate the press plate 40, the positioning plate 20, and the base plate 10. The lip portions 51 are formed with a plurality of spaced locking holes 511. One end of the fixing plate 50, corresponding to the second connecting portions 32, is provided with a raised board 52. The raised board 52 protrudes outward opposite the press plate 40. The raised board 52 is formed with a plurality of locking holes 521 for the fixing board 50 to be locked to the inner wall of the case 210 by a plurality of locking members 300.

The cover plate 60 is disposed on the second connecting portions 32 of the metallic plates 30. The cover plate 60 has an insulation effect. One side of the cover plate 60, facing the metallic plates 30, is provided with a plurality of first connecting members 61 corresponding to the second connecting portions 32. The first connecting members 61 are conductive members. The first connecting members 61 are formed with locking holes 611 corresponding to the locking holes 321 of the second connecting portions 32, such that the first connecting members 61 and second connecting portions 32 are connected by screws. Another side of the cover plate 60 is provided with a plurality of second connecting members 62. The second connecting members 62 are conductive members and electrically connected with the first connecting members 61, respectively. The second connecting members 62 are staggered each other. Each second connecting member 62 is formed with a locking hole 621. Two ends of each second connecting member 62 are bent to form a support portion 622. The support portion 622 is perpendicular to the second connecting member 62, such that the second connecting member 62 has a U-like shape to strengthen the structure of the second connecting member 62. In the present invention, the cover plate 60 is a PCB circuit board. The first connecting members 61 and the second connecting members 62 are disposed on the cover plate 60. The side of the cover plate 60, having the first connecting members 61, is etched with circuit lines 63, so that first connecting members 61 and the second connecting members 62 are electrically connected through the circuit lines 63. The circuit lines 63 are copper foils.

Figure 5:
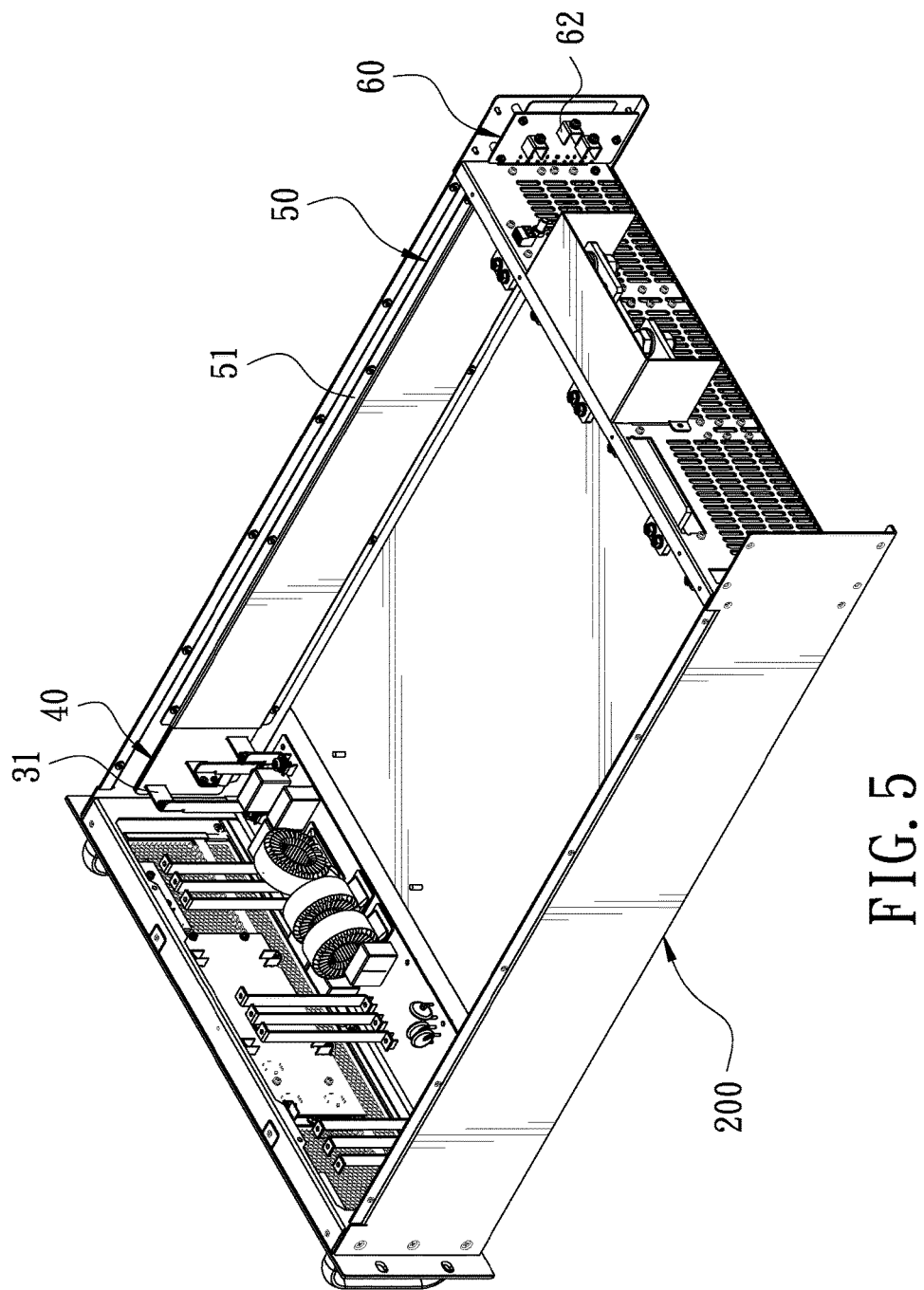
FIG. 5 is a schematic view showing the use of the present invention.

FIG. 4 is a schematic view showing the assembly of the present invention. FIG. 5 is a schematic view showing the use of the present invention. In cooperation with FIG. 2, when the power transmission structure of the power supply unit is used, the fixing plate 20 is first placed on the base plate 10 and the metallic plates 30 are disposed in the through troughs 21 of the positioning plate 20, respectively. The press plate 40 is to cover the metallic plates 30 and placed on the positioning plate 20. The first connecting portions 31 of the metallic plates 30 extend out of the slots 41 of the press plate 40, respectively. Finally, the fixing plate 50 is to cover the press plate 40, and the press plate 40 is accommodated in the accommodation space of the fixing plate 50. After that, the fixing plate 50 is locked at a predetermined position on the inner wall of the case 210 of the power supply unit 200. The fixing plate 50 makes the base plate 10, the positioning plate 20, the metallic plates 30, and the press plate 40 tightly attach to the inner wall of the case 210 of the power supply unit 200 and be positioned in the accommodation space of the fixing plate 50. The second connecting portions 32 of the metallic plates 30 are further connected with the cover plate 60. The connecting portions 32 are respectively connected with the first connecting members 61 and further electrically connected with the second connecting members 62.

In the present invention, the first connecting portions 31 of the metallic plates 30 correspond in position to the components of the power supply unit 200 respectively for the components of the power supply unit 200 to be connected with the first connecting portions 31. The second connecting portions 32 of the metallic plates 30 and the cover plate 60 extend out of the case 210 of the power supply unit 200, enabling the second connecting members 62 to function as the output end and the input end of the power supply unit 200. An external device can be connected with the second connecting members 62 and further electrically connected with the second connecting portions 32, such that the external device can be electrically connected with the power supply unit 200 via the metallic plates 30 for power transmission.

It is noted that all the base plate 10, the positioning plate 20, the metallic plates 30, and the press plate 40, and the fixing plate 50 are thin plates. When they are assembled and locked to the inner wall of the power supply unit 200, they will be tightly attached to the inner wall of the power supply unit 200, not occupying space.

The required interior accommodation space of the power supply unit can be reduced so as to flatten the power transmission structure and reduce the volume of the power supply unit.

In addition, the power transmission structure is tightly attached to the inner wall of the power supply unit 200, so the space for the power supply unit 200 to provide heat dissipation holes and a heat sink is increased, enabling the power supply unit 200 to have a better heat dissipation effect.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A power transmission structure of a power supply unit, the power supply unit having a case, the power transmission structure comprising:
    a base plate, the base plate being made of an insulation material and disposed at an inner wall of the case;
    a positioning plate, the positioning plate being made of an insulation material, the positioning plate being parallel to the base plate and disposed on the base plate, the positioning plate being formed with a plurality of through troughs, the through troughs being spaced and parallel to each other;
    a plurality of metallic plates, the metallic plates being located in the through troughs of the positioning plate, one end of each metallic plate being provided with a first connecting portion, the first connecting portion perpendicularly extending out of the positioning plate, another end of each metallic plate being provided with a second connecting portion, the second connecting portion perpendicularly extending out of the positioning plate;
    a press plate, the press plate being made of an insulation material, the press plate being parallel to the metallic plates and disposed on the metallic plates, the first connecting portions and the second connecting portions of the metallic plates extending out of the press plate; and
    a fixing plate, the fixing plate being disposed on the press plate, the fixing plate having a width greater than that of the press plate, two sides of the fixing plate being provided with lip portions, the fixing plate being formed with an accommodation space between the lip portions for accommodating the press plate, the positioning plate and the base plate, the lip portions being formed with a plurality of spaced locking holes, the fixing board being locked to the inner wall of the case via a plurality of locking members.

2. The power transmission structure of a power supply unit as claimed in claim 1, wherein the press plate is formed with a plurality of slots corresponding to the first connecting portions of the metallic plates for the first connecting portions to extend out of the slots, and the second connecting portions of the metallic plates are exposed out of the press plate.

3. The power transmission structure of a power supply unit as claimed in claim 1, wherein one end of the fixing plate is provided with a raised board, and the raised board is formed with a plurality of locking holes.

4. The power transmission structure of a power supply unit as claimed in claim 1, further comprising a cover plate, the cover plate being disposed on the second connecting portions of the metallic plates, one side of the cover plate, facing the metallic plates, being provided with a plurality of first connecting members corresponding to the second connecting portions, another side of the cover plate being provided with a plurality of second connecting members, the second connecting members being electrically connected with the first connecting members, respectively.

5. The power transmission structure of a power supply unit as claimed in claim 4, wherein each of the first connecting members is formed with at least one locking hole, and each of the second connecting members is formed with at least one locking hole.

6. The power transmission structure of a power supply unit as claimed in claim 4, wherein the second connecting members are staggered each other.

7. The power transmission structure of a power supply unit as claimed in claim 4, wherein two ends of each second connecting member are bent to form a support portion, enabling the second connecting member in a U-like shape.

8. The power transmission structure of a power supply unit as claimed in claim 1, wherein the first connecting portion has a length greater than that of the second connecting portion.

9. The power transmission structure of a power supply unit as claimed in claim 1, wherein the second connecting portions of the metallic plates extend out of the case.

10. The power transmission structure of a power supply unit as claimed in claim 1, wherein the base plate, the positioning plate, the metallic plates, and the press plate are thin plates and parallel to each other so as to flatten the power transmission structure.

* * * * *